(12) United States Patent
Miyamoto et al.

(10) Patent No.: US 12,123,082 B2
(45) Date of Patent: *Oct. 22, 2024

(54) NON-ORIENTED ELECTRICAL STEEL SHEET

(71) Applicant: JFE STEEL CORPORATION, Tokyo (JP)

(72) Inventors: Yukino Miyamoto, Tokyo (JP); Yoshiaki Zaizen, Tokyo (JP); Yoshihiko Oda, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 473 days.

This patent is subject to a terminal disclaimer.

(21) Appl. No.: 17/594,382

(22) PCT Filed: Apr. 13, 2020

(86) PCT No.: PCT/JP2020/016346
§ 371 (c)(1),
(2) Date: Oct. 14, 2021

(87) PCT Pub. No.: WO2020/213576
PCT Pub. Date: Oct. 22, 2020

(65) Prior Publication Data
US 2022/0195570 A1    Jun. 23, 2022

(30) Foreign Application Priority Data
Apr. 17, 2019   (JP) .................. 2019-078814

(51) Int. Cl.
C22C 38/14    (2006.01)
C22C 38/00    (2006.01)
(Continued)

(52) U.S. Cl.
CPC ............ *C22C 38/14* (2013.01); *C22C 38/002* (2013.01); *C22C 38/008* (2013.01); *C22C 38/02* (2013.01); *C22C 38/04* (2013.01); *C22C 38/12* (2013.01)

(58) Field of Classification Search
CPC ..... H01F 1/14775; C23C 10/02; C23C 10/46; C23C 10/60; C23C 16/24; C21D 1/76;
(Continued)

(56) References Cited

U.S. PATENT DOCUMENTS 6,241,829 B1    6/2001    Fujita et al.
6,527,876 B2    3/2003    Namikawa et al.
(Continued)

FOREIGN PATENT DOCUMENTS

CN    102816972 A    12/2012
CN    108884535 A    11/2018
(Continued)

OTHER PUBLICATIONS

Sep. 20, 2022, Office Action issued by the China National Intellectual Property Administration in the corresponding Chinese Patent Application No. 202080028610.6 with English language search report.

(Continued)

*Primary Examiner* — Jie Yang
(74) *Attorney, Agent, or Firm* — KENJA IP LAW PC

(57) ABSTRACT

A non-oriented electrical steel sheet having: low high-frequency iron loss and high magnetic flux density; an inner layer and surface layers provided on both sides of the inner layer, the surface layers and the inner layer having specific chemical compositions; the thickness t of 0.01 mm to 0.35 mm; a multilayer ratio of $t_1$ to t of 0.10 to 0.70, $t_1$ denoting a total thickness of the surface layers; a difference between $[Si]_1$ and $[Si]_0$ of 1.0 mass % to 4.5 mass % or less, $[Si]_1$
(Continued)

denoting a Si content in each of the surface layers and $[Si]_0$ denoting a Si content in the inner layer; and a difference between $[Mn]_0$ and $[Mn]_1$ of 0.01 mass % to 0.40 mass %, $[Mn]_0$ denoting a Mn content at a mid-thickness position t/2 and $[Mn]_1$ denoting an average Mn content in a region from a surface to a position at a depth of $(1/10)t$.

4 Claims, 6 Drawing Sheets

(51) Int. Cl.
*C22C 38/02* (2006.01)
*C22C 38/04* (2006.01)
*C22C 38/12* (2006.01)

(58) Field of Classification Search
CPC .... C21D 2251/02; C21D 6/008; C21D 8/005; C21D 8/1255; C21D 8/1277; C21D 9/46; C22C 38/04

See application file for complete search history.

(56) References Cited

U.S. PATENT DOCUMENTS

| | | | |
|---|---|---|---|
| 11,295,881 | B2 | 4/2022 | Natori et al. |
| 2014/0342150 | A1 | 11/2014 | Wakisaka |
| 2015/0013850 | A1 | 1/2015 | Imamura et al. |
| 2018/0340239 | A1 | 11/2018 | Okubo et al. |
| 2019/0112697 | A1 | 4/2019 | Hiratani et al. |
| 2022/0290287 | A1* | 9/2022 | Miyamoto ............ C22C 38/004 |

FOREIGN PATENT DOCUMENTS

| | | |
|---|---|---|
| CN | 109563583 A | 4/2019 |
| EP | 0987341 A1 | 3/2000 |
| EP | 3351649 A1 | 7/2018 |
| EP | 3438314 A1 | 2/2019 |
| JP | H04246157 A | 9/1992 |
| JP | H09291351 A | 11/1997 |
| JP | H11293422 A | 10/1999 |
| JP | 2010132938 A | 6/2010 |
| JP | 2012251191 A | 12/2012 |
| JP | 2019012777 A | 1/2019 |
| KR | 1020180040658 A | 4/2018 |
| KR | 1020180120717 A | 11/2018 |
| WO | 2013179438 A1 | 12/2013 |
| WO | 2017170749 A1 | 10/2017 |

OTHER PUBLICATIONS

May 24, 2022, the Extended European Search Report issued by the European Patent Office in the corresponding European Patent Application No. 20791472.2.

Jul. 14, 2020, International Search Report issued in the International Patent Application No. PCT/JP2020/016346.

Apr. 3, 2023, Office Action issued by the Korean Intellectual Property Office in the corresponding Korean Patent Application No. 10-2021-7033175 with English language concise statement of relevance.

* cited by examiner

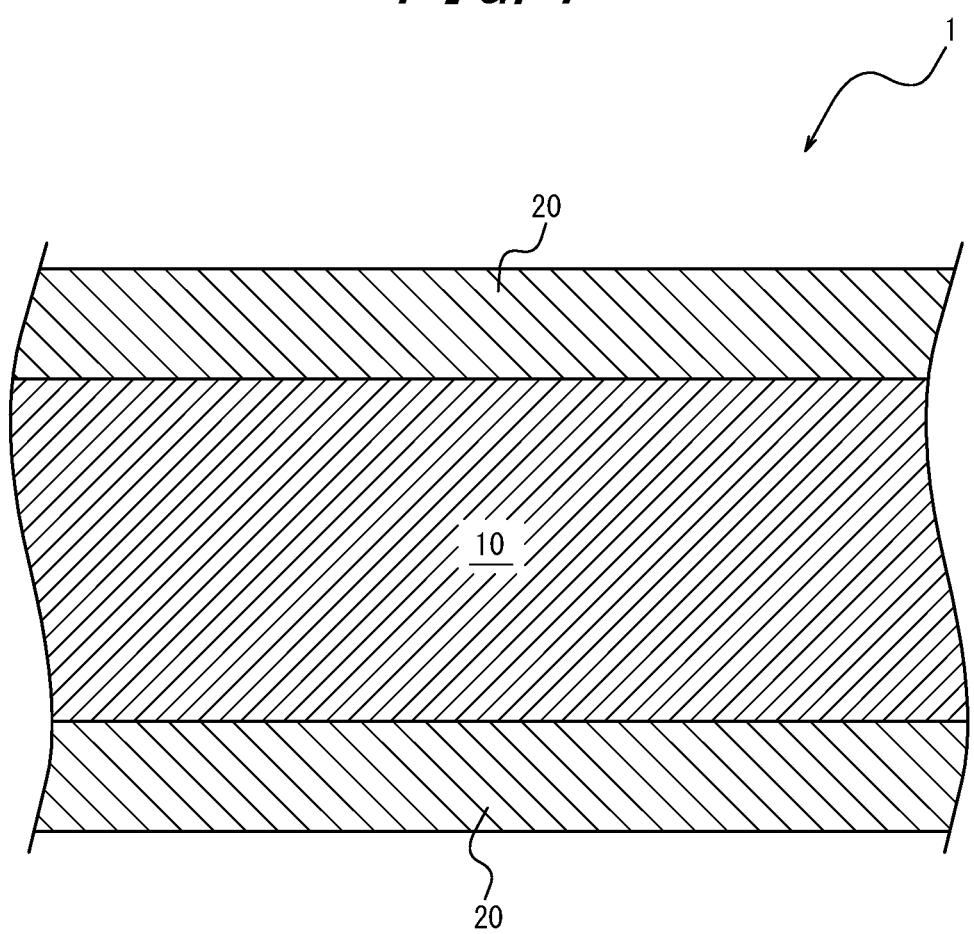

NON-ORIENTED ELECTRICAL STEEL SHEET

TECHNICAL FIELD

This disclosure relates to a non-oriented electrical steel sheet, in particular, a non-oriented electrical steel sheet having both low high-frequency iron loss and high magnetic flux density.

BACKGROUND

Motors for hybrid electric vehicles and cleaners are driven in a high-frequency region such as 400 Hz to 2 kHz from the viewpoint of reducing the size and achieving high efficiency. Therefore, for non-oriented electrical steel sheets used for core materials of such motors, electrical steel sheets having low high-frequency iron loss and high magnetic flux density are demanded.

To reduce the high-frequency iron loss, it is effective to increase specific resistance. Therefore, high-Si steel having increased specific resistance through the increase in Si content has been developed. However, since Si is a non-magnetic element, the increase in Si content leads to lower saturation magnetization.

Therefore, as means for achieving both high-frequency iron loss reduction and high magnetic flux density, gradient Si magnetic materials having controlled Si concentration gradient in a thickness direction of electrical steel sheets have been developed. For example, JP H 11-293422 A (PTL 1) proposes an electrical steel sheet having a Si concentration gradient in a thickness direction in which the Si concentration in a surface of the steel sheet is higher than that of a mid-thickness part of the steel sheet. Specifically, the electrical steel sheet has a mid-thickness part with a Si concentration of 3.4% or more while having, on its both surfaces, surface layers with a Si concentration of 5 mass % or more and 8 mass % or less. Further, the thickness of the surface layers is 10% or more of the sheet thickness.

CITATION LIST

Patent Literature

PTL 1: JP11-293422 A

SUMMARY

However, when conventional gradient Si magnetic materials as proposed in PTL 1 are used as the iron core materials of electric appliances whose highest frequency is several kHz, the hysteresis loss is high and thus the iron loss is not sufficiently reduced.

It could thus be helpful to provide a non-oriented electrical steel sheet having both low iron loss in a high frequency range such as 400 Hz or more and 2 kHz or less and high magnetic flux density.

Solution to Problem

The inventors made intensive studies of a method of solving the problem, and as a result, found that in order to reduce iron loss in a high frequency range such as 400 Hz or more and 2 kHz or less, it is important to reduce the difference in magnetostriction between surface layers and an inner layer of a steel sheet and stress generated by the difference in lattice constant. This disclosure is based on the above finding and has the following primary features.

1. A non-oriented electrical steel sheet comprising an inner layer and surface layers provided on both sides of the inner layer, each of the surface layers having a chemical composition containing (consisting of), in mass %,
   Si: 2.5% or more and 7.0% or less,
   Mn: 0.50% or less, and
   at least one selected from the group consisting of P: 0.010% or more and 0.100% or less, Sn: 0.001% or more and 0.10% or less, and Sb: 0.001% or more and 0.10% or less, with the balance being Fe and inevitable impurities,
   the inner layer having a chemical composition containing (consisting of), in mass %,
   Si: 1.5% or more and 5.0% or less,
   Mn: 0.01% or more and 0.50% or less, and
   at least one selected from the group consisting of P: 0.010% or more and 0.100% or less, Sn: 0.001% or more and 0.10% or less, and Sb: 0.001% or more and 0.10% or less, with the balance being Fe and inevitable impurities,
   wherein the non-oriented electrical steel sheet has:
   a sheet thickness t of 0.01 mm or more and 0.35 mm or less;
   a multilayer ratio of $t_1$ to t represented by $t_1/t$ of 0.10 or more and 0.70 or less, where $t_1$ denotes a total thickness of the surface layers;
   a difference between $[Si]_1$ and $[Si]_0$ ($[Si]_1 - [Si]_0$) represented by $\Delta Si$ of 1.0 mass % or more and 4.5 mass % or less, where $[Si]_1$ denotes a Si content in each of the surface layers and $[Si]_0$ denotes a Si content in the inner layer, and
   a difference between $[Mn]_0$ and $[Mn]_1$ ($[Mn]_0 - [Mn]_1$) represented by $\Delta Mn$ of 0.01 mass % or more and 0.40 mass % or less, where $[Mn]_0$ denotes a Mn content at a mid-thickness position $t/2$ and $[Mn]_1$ denotes an average Mn content in a region from a surface of the non-oriented electrical steel sheet to a position at a depth of $(1/10)t$.

2. The non-oriented electrical steel sheet according to 1, wherein $\Delta Mn$ is 0.05 mass % or more and 0.40 mass % or less.

3. The non-oriented electrical steel sheet according to 1. or 2, further comprising a texture having $\{100\}/\{111\}$ of 0.55 or more and 0.90 or less in a section of an orientation distribution function at $\Phi_2 = 45°$ in a plane at a depth of $\frac{1}{4}$ of the sheet thickness from a surface of the non-oriented electrical steel sheet, where $\{100\}/\{111\}$ represents a ratio of an accumulation degree of $\{100\}$ planes to an accumulation degree of $\{111\}$ planes.

Advantageous Effect

According to this disclosure, it is possible to provide a non-oriented electrical steel sheet having both low high-frequency iron loss and high magnetic flux density.

BRIEF DESCRIPTION OF THE DRAWINGS

In the accompanying drawings:

FIG. 1 is a schematic diagram illustrating the structure of a non-oriented electrical steel sheet according to one of the embodiments of this disclosure.

DETAILED DESCRIPTION

Detailed description is given below. The following description merely presents examples of preferred embodiments of this disclosure, and this disclosure is not limited to these embodiments.

[Non-Oriented Electrical Steel Sheet]

Figure 2A:
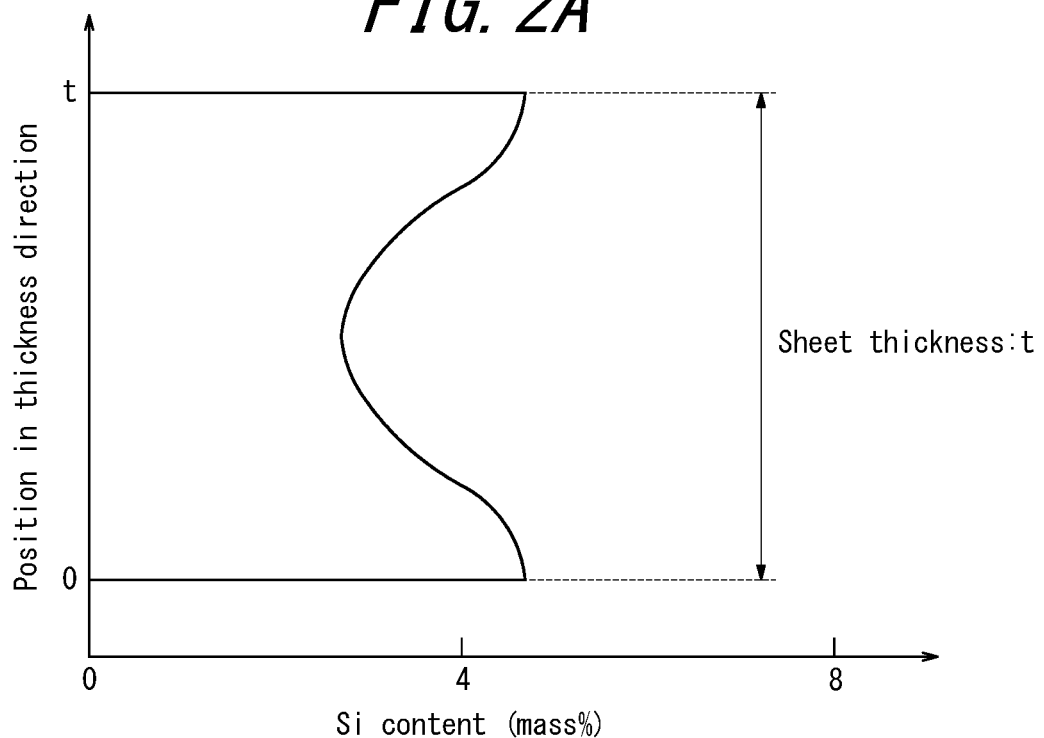
FIGS. 2A and 2B are schematic diagrams illustrating examples of the Si content profile in a thickness direction of the non-oriented electrical steel sheet.
Figure 2B:
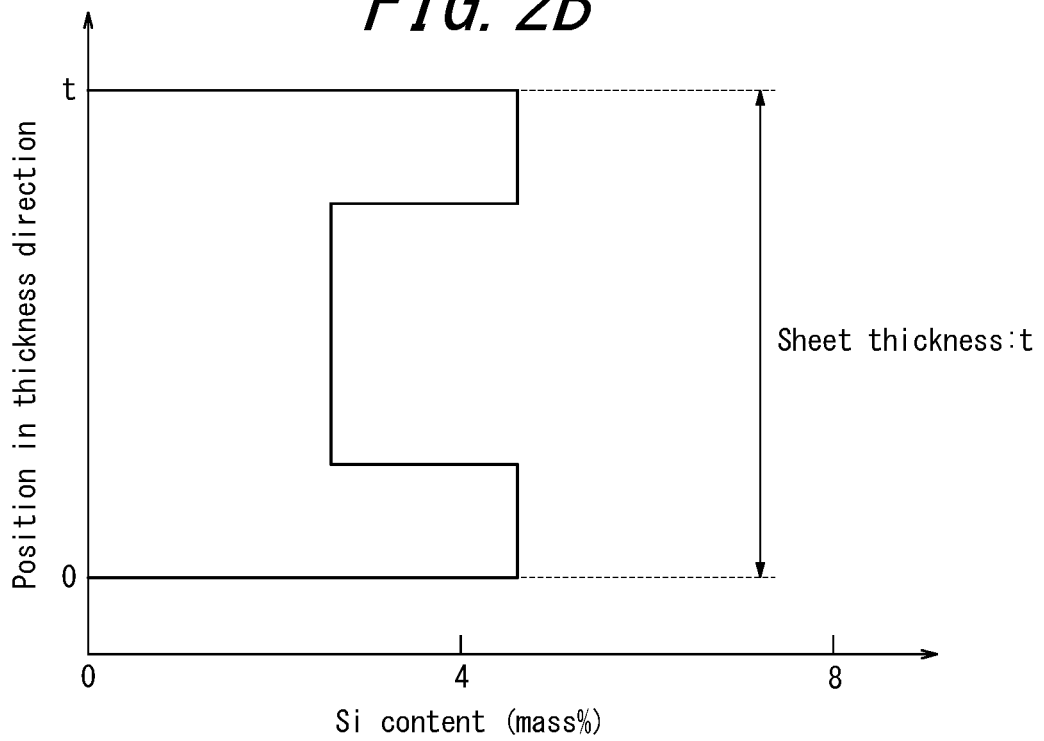

FIG. 1 is a schematic diagram illustrating the structure of a non-oriented electrical steel sheet according to one of the embodiments of this disclosure. Further, FIGS. 2A and 2B are schematic diagrams illustrating examples of the Si content profile in a thickness direction of the non-oriented electrical steel sheet. In FIGS. 2A and 2B, the vertical axis indicates a position in the thickness direction, 0 denotes one surface of the non-oriented electrical steel sheet, and t denotes the other surface of the non-oriented electrical steel sheet.

As illustrated in FIG. 1, a non-oriented electrical steel sheet 1 of this disclosure (hereinafter, also referred to simply as "steel sheet") has an inner layer 10 and surface layers 20 provided on both sides of the inner layer 10, the inner layer 10 and the surface layers 20 having different Si contents. The Si content may change continuously (FIG. 2A) or stepwise (FIG. 2B) in the thickness direction of the steel sheet. When the Si content changes stepwise, it may change in two or more steps. In the following description, the "surface layers" indicate surface layers provided on the surfaces of both sides of the non-oriented electrical steel sheet. Therefore, in this disclosure, both a first surface layer provided on one surface of the non-oriented electrical steel sheet and a second surface layer provided on the other surface of the non-oriented electrical steel sheet satisfy the conditions described below.

A part having a Si content equal to or more than an average of Si contents over the total sheet thickness of the non-oriented electrical steel sheet is defined as a "surface layer" and a part having a Si content below the average of Si contents over the total sheet thickness of the non-oriented electrical steel sheet is defined as an "inner layer". As described below, when the non-oriented electrical steel sheet is manufactured by cladding two types of steel materials having different Si contents (high Si material and low Si material) with each other, typically, a part made of the high Si material is a surface layer and a part made of the low Si material is an inner layer.

In this case, the Si content in each of the surface layers is substantially constant and the Si content in the inner layer is also substantially constant.

[Chemical Composition]

First, the chemical compositions of each of the surface layers and the inner layer are described. In the following description, when components are expressed in "%", this refers to "mass %" unless otherwise stated.

[Chemical Composition of Surface Layers]

First, the chemical composition of each of the surface layers will be described. In this disclosure, both the first surface layer provided on one surface of the non-oriented electrical steel sheet and the second surface layer provided on the other surface of the non-oriented electrical steel sheet have the chemical composition described below. The chemical composition of the first surface layer and the chemical composition of the second surface layer may be typically the same but may be different from each other. Further, the content of an element in each of the surface layers indicates an average content of the element in each surface layer.

Si: 2.5% or More and 7.0% or Less

Si is an element having an effect of increasing the electrical resistance of the steel sheet and reducing eddy current loss. When the Si content in each of the surface layers ($[Si]_1$) is less than 2.5%, the eddy current loss cannot be effectively reduced. Therefore, the Si content in each of the surface layers is set to 2.5% or more, preferably 3.0% or more, and more preferably more than 3.5%. On the other hand, when the Si content in each of the surface layers is more than 7.0%, the magnetic flux density decreases due to lower saturation magnetization and the manufacturability is deteriorated. Therefore, the Si content in each of the surface layers is set to 7.0% or less, preferably 6.5% or less, and more preferably 6.0% or less. As described above, a Si content of 2.5% or more and 7.0% or less in each of the surface layers means that the average Si content in the first surface layer is 2.5% or more and 7.0% or less and the average Si content in the second surface layer is 2.5% or more and 7.0% or less. The Si content in the first surface layer may be the same as or different from the Si content in the second surface layer. The same applies to other elements.

Mn: 0.50% or Less

A Mn content more than 0.50% increases iron loss through an increase in magnetostriction and a decrease in magnetic permeability, and incurs cost increase. Therefore, the Mn content is set to 0.50% or less. On the other hand, from the aforementioned viewpoint, the Mn content is preferably as low as possible and no lower limit is placed on the Mn content and the Mn content may be 0%.

The chemical composition in each of the surface layers further contains at least one selected from the group consisting of P: 0.010% or more and 0.100% or less, Sn: 0.001% or more and 0.10% or less, and Sb: 0.001% or more and 0.10% or less.

P: 0.010% or More and 0.100% or Less

The addition of P greatly improves the texture, which makes it possible to improve the magnetic flux density and lower the hysteresis loss. When P is added, to obtain the effect, the P content is set to 0.010% or more. On the other hand, a P content exceeding 0.100% causes saturation of the effect and additionally, lowers the manufacturability. Therefore, the P content is set to 0.100% or less.

Sn: 0.001% or More and 0.10% or Less

As with P, the addition of Sn greatly improves the texture, which makes it possible to improve the magnetic flux density and lower the hysteresis loss. When Sn is added, to obtain the effect, the Sn content is set to 0.001% or more. On the other hand, a Sn content exceeding 0.10% causes saturation of the effect and additionally, lowers the manufacturability and incurs cost increase. Therefore, the Sn content is set to 0.10% or less.

Sb: 0.001% or More and 0.10% or Less

As with P and Sn, the addition of Sb greatly improves the texture, which makes it possible to improve the magnetic flux density and lower the hysteresis loss. When Sb is added, to obtain the effect, the Sb content is set to 0.001% or more. On the other hand, a Sb content exceeding 0.10% causes saturation of the effect and additionally, lowers the manufacturability and incurs cost increase. Therefore, the Sb content is set to 0.10% or less.

In one embodiment of this disclosure, each of the surface layers has a chemical composition containing the above elements with the balance being Fe and inevitable impurities.

In another embodiment of this disclosure, the chemical composition of each of the surface layers may optionally further contain the following elements.

C: 0.0090% or Less

C is a grain-boundary-strengthening element, and by adding C, the elongation of the steel sheet can be improved. Therefore, C can be optionally added. However, when a large amount of C is added, carbides are precipitated by aging, leading to an increase in iron loss. Therefore, in the case of adding C, the C content is set to 0.0090% or less. On the other hand, no lower limit is placed on the C content and the C content may be 0%. However, to enhance the effect of adding C, the C content is preferably set to 0.0015% or more.

S: 0.0050% or Less

S is an element that forms sulfides such as MnS and inhibits grain growth. Therefore, the addition of S can suppress the increase in eddy current loss caused by crystal grain growth during annealing at high temperatures such as 1000° C. or higher. However, a S content exceeding 0.0050% decreases solute Mn through the reaction between S and Mn, and causes a variation in the Mn distribution in the thickness direction, which may make it impossible to efficiently reduce iron loss. Therefore, in the case of adding S, the S content is set to 0.0050% or less. On the other hand, no lower limit is placed on the S content and the S content may be 0%. However, to further reduce eddy current loss, the S content is preferably set to 0.0010% or more.

Al: 0.10% or Less

Al is an element that forms nitrides and inhibits grain growth. Therefore, the addition of Al can suppress the increase in eddy current loss caused by crystal grain growth during annealing at high temperatures such as 1000° C. or higher. However, an Al content exceeding 0.10% excessively forms nitrides, thus increasing the hysteresis loss. Therefore, in the case of adding Al, the Al content is set to 0.10% or less. On the other hand, no lower limit is placed on the Al content and the Al content may be 0%. However, to further reduce eddy current loss, the Al content is preferably set to 0.0030% or more.

Ti: 0.030% or Less, Nb: 0.030% or Less, V: 0.030% or Less, Zr: 0.030% or Less

Ti, Nb, V, and Zr are elements that form nitrides and carbides and inhibit grain growth. Therefore, the addition of at least one selected from the group consisting of Ti, Nb, V, and Zr can suppress the increase in eddy current loss caused by crystal grain growth during annealing at high temperatures such as 1000° C. or higher. However, when the content of each of these elements exceeds 0.030%, excessive nitrides and/or carbides are formed, resulting in an increase in hysteresis loss. Therefore, when these elements are added, the content of each of these elements is set to 0.030% or less. On the other hand, no lower limit is placed on the content of each of these elements, and the content of each of these elements may be 0%. However, to further reduce eddy current loss, the content of each of the elements to be added is preferably set to 0.0020% or more.

Accordingly, a non-oriented electrical steel sheet in one embodiment of this disclosure can have surface layers, each of the surface layers having a chemical composition containing, in mass %,
Si: 2.5% or more and 7.0% or less,
Mn: 0.50% or less, and
at least one selected from the group consisting of P: 0.010% or more and 0.100% or less, Sn: 0.001% or more and 0.10% or less, and Sb: 0.001% or more and 0.10% or less,
C: 0% or more and 0.0090% or less,
S: 0% or more and 0.0050% or less,
Al: 0% or more and 0.10% or less, and
at least one selected from the group consisting of Ti, Nb, V, and Zr: 0% or more and 0.030% or less, with the balance being Fe and inevitable impurities.

[Chemical Composition of Inner Layer]

Next, the chemical composition of the inner layer will be described. The content of an element in the inner layer refers to the average content of the element on the inner side in the thickness direction of a boundary between the surface layer and the inner layer, the boundary being determined as a position having the average Si content.

Si: 1.5% or More and 5.0% or Less

Si is an element having an effect of increasing the electrical resistance of the steel sheet and reducing eddy current loss. A Si content in the inner layer ($[Si]_0$) of less than 1.5% causes an increase in eddy current loss. Therefore, the Si content in the inner layer is set to 1.5% or more. On the other hand, in the case of the Si content in the inner layer exceeding 5.0%, when a motor core is manufactured from the non-oriented electrical steel sheet, the core is broken during punching. Therefore, the Si content in the inner layer is set to 5.0% or less, and preferably 4.0% or less.

Mn: 0.01% or More and 0.50% or Less

Mn is an element having an effect of suppressing red brittleness during hot rolling in the manufacturing process of the non-oriented electrical steel sheet. Even after siliconizing treatment, the Mn amount in the inner layer is almost the same as that in the state of a slab, and thus the Mn content in the inner layer is set to 0.01% or more to obtain the effect. On the other hand, a Mn content exceeding 0.50% increases iron loss through an increase in magnetostriction and a decrease in magnetic permeability, and incurs cost increase. Therefore, the Mn content is set to 0.50% or less.

The chemical composition of the inner layer further contains at least one selected from the group consisting of P: 0.010% or more and 0.100% or less, Sn: 0.001% or more and 0.10% or less, and Sb: 0.001% or more and 0.10% or less.

P: 0.010% or More and 0.100% or Less

The addition of P greatly improves the texture, which makes it possible to improve the magnetic flux density and lower the hysteresis loss. When P is added, to obtain the effect, the P content is set to 0.010% or more. On the other hand, a P content exceeding 0.100% causes saturation of the effect and additionally, lowers the manufacturability. Therefore, the P content is set to 0.100% or less. The P content in the inner layer may be the same as or different from the P content in each of the surface layers.

Sn: 0.001% or More and 0.10% or Less

As with P, the addition of Sn greatly improves the texture, which makes it possible to improve the magnetic flux density and lower the hysteresis loss. When Sn is added, to obtain the effect, the Sn content is set to 0.001% or more. On the other hand, a Sn content exceeding 0.10% causes saturation of the effect and additionally, lowers the manufacturability and incurs cost increase. Therefore, the Sn content is set to 0.10% or less. The Sn content in the inner layer may be the same as or different from the Sn content in each of the surface layers.

Sb: 0.001% or More and 0.10% or Less

As with P and Sn, the addition of Sb greatly improves the texture, which makes it possible to improve the magnetic flux density and lower the hysteresis loss. When Sb is added, to obtain the effect, the Sb content is set to 0.001% or more. On the other hand, a Sb content exceeding 0.10% causes saturation of the effect and additionally, lowers the manufacturability and incurs cost increase. Therefore, the Sb content is set to 0.10% or less. The Sb content in the inner layer may be the same as or different from the Sb content in each of the surface layers.

In one embodiment of this disclosure, the inner layer has a chemical composition containing the above elements with the balance being Fe and inevitable impurities.

In another embodiment of this disclosure, the chemical composition of the inner layer may optionally further contain the following elements.

C: 0.0090% or Less

C is a grain-boundary-strengthening element, and by adding C, the elongation of the steel sheet can be improved. Therefore, C can be optionally added. However, when a large amount of C is added, carbides are precipitated by aging, leading to an increase in iron loss. Therefore, in the case of adding C, the C content is set to 0.0090% or less. On the other hand, no lower limit is placed on the C content and the C content may be 0%. However, to enhance the effect of adding C, the C content is preferably set to 0.0015% or more.

S: 0.0050% or Less

S is an element that forms sulfides such as MnS and inhibits grain growth. Therefore, the addition of S can suppress the increase in eddy current loss caused by crystal grain growth during annealing at high temperatures such as 1000° C. or higher. However, a S content exceeding 0.0050% decreases solute Mn through the reaction between S and Mn, and causes a variation in the Mn distribution in the thickness direction, which may make it impossible to efficiently reduce iron loss. Therefore, in the case of adding S, the S content is set to 0.0050% or less. On the other hand, no lower limit is placed on the S content and the S content may be 0%. However, to further reduce eddy current loss, the S content is preferably set to 0.0010% or more.

Al: 0.10% or Less

Al is an element that forms nitrides and inhibits grain growth. Therefore, the addition of Al can suppress the increase in eddy current loss caused by crystal grain growth during annealing at high temperatures such as 1000° C. or higher. However, an Al content exceeding 0.10% excessively forms nitrides, thus increasing the hysteresis loss. Therefore, in the case of adding Al, the Al content is set to 0.10% or less. On the other hand, no lower limit is placed on the Al content and the Al content may be 0%. However, to further reduce eddy current loss, the Al content is preferably set to 0.0030% or more.

Ti: 0.030% or Less, Nb: 0.030% or Less, V: 0.030% or Less, Zr: 0.030% or Less

Ti, Nb, V, and Zr are elements that form nitrides and carbides and inhibit grain growth. Therefore, the addition of at least one selected from the group consisting of Ti, Nb, V, and Zr can suppress the increase in eddy current loss caused by crystal grain growth during annealing at high temperatures such as 1000° C. or higher. However, when the content of each of these elements exceeds 0.030%, excessive nitrides and/or carbides are formed, resulting in an increase in hysteresis loss. Therefore, when these elements are added, the content of each of these elements is set to 0.030% or less. On the other hand, no lower limit is placed on the content of each of these elements, and the content of each of these elements may be 0%. However, to further reduce eddy current loss, the content of each of the elements to be added is preferably set to 0.0020% or more.

Accordingly, the non-oriented electrical steel sheet in one embodiment of this disclosure has an inner layer having a chemical composition containing, in mass %, Si: 1.5% or more and 5.0% or less, Mn: 0.01% or more and 0.50% or less, and at least one selected from the group consisting of P: 0.010% or more and 0.100% or less, Sn: 0.001% or more and 0.10% or less, and Sb: 0.001% or more and 0.10% or less, C: 0% or more and 0.0090% or less, S: 0% or more and 0.0050% or less, Al: 0% or more and 0.10% or less, and at least one selected from the group consisting of Ti, Nb, V, and Zr: 0% or more and 0.030% or less, with the balance being Fe and inevitable impurities.

[Sheet Thickness]

t: 0.01 mm or More and 0.35 mm or Less

When the sheet thickness of the non-oriented electrical steel sheet t is less than 0.01 mm, cold rolling and annealing in manufacturing the non-oriented electrical steel sheet are difficult, significantly increasing costs. Therefore, t is set to 0.01 mm or more, and preferably 0.05 mm or more. On the other hand, when t is more than 0.35 mm, the eddy current loss is increased, leading to an increase in total iron loss. Therefore, t is set to 0.35 mm or less, and preferably 0.30 mm or less.

[Difference in Si Content]

In this disclosure, $\Delta Si$ defined as a difference between a Si content in each of the surface layers: $[Si]_1$ and a Si content in the inner layer: $[Si]_0$ ($[Si]_1-[Si]_0$) is set to 1.0 mass % or more and 4.5 mass % or less. The reason for this limitation will be described below.

To examine the effect of the difference in Si content ($\Delta Si$) between the surface layers and the inner layer on the magnetic properties, non-oriented electrical steel sheets having different $\Delta Si$ were manufactured by the following procedures to evaluate the magnetic properties.

First, steel slabs having a chemical composition consisting of Si: 2.0%, Mn: 0.10%, Sn: 0.04% with the balance being Fe and inevitable impurities were hot rolled to obtain hot rolled steel sheets. The hot-rolled steel sheets were subjected to hot-rolled sheet annealing of 950° C.×30 s followed by cold rolling to obtain cold-rolled steel sheets with a sheet thickness t: 0.20 mm. Then, the cold-rolled steel sheets were subjected to siliconizing treatment in a $SiCl_4$ atmosphere at a temperature of 1200° C., followed by diffusion treatment in a nitrogen atmosphere at 1200° C. and cooled at 10° C./s to obtain non-oriented electrical steel sheets. The surface layers on each of the obtained non-oriented electrical steel sheets had the same chemical composition.

Test pieces having a width of 30 mm and a length of 180 mm were collected from each of the obtained non-oriented electrical steel sheets and subjected to the Epstein test to evaluate the magnetic properties. In the Epstein test, L-direction test pieces were collected so that the length direction of the test pieces was parallel to the rolling direction (L direction), and C-direction test pieces were collected so that the length direction of the test pieces was parallel to the direction orthogonal to the rolling direction (C direction). The L- and C-direction test pieces were used in equal amounts to measure the averages of the magnetic properties in the L and C directions.

Figure 3:
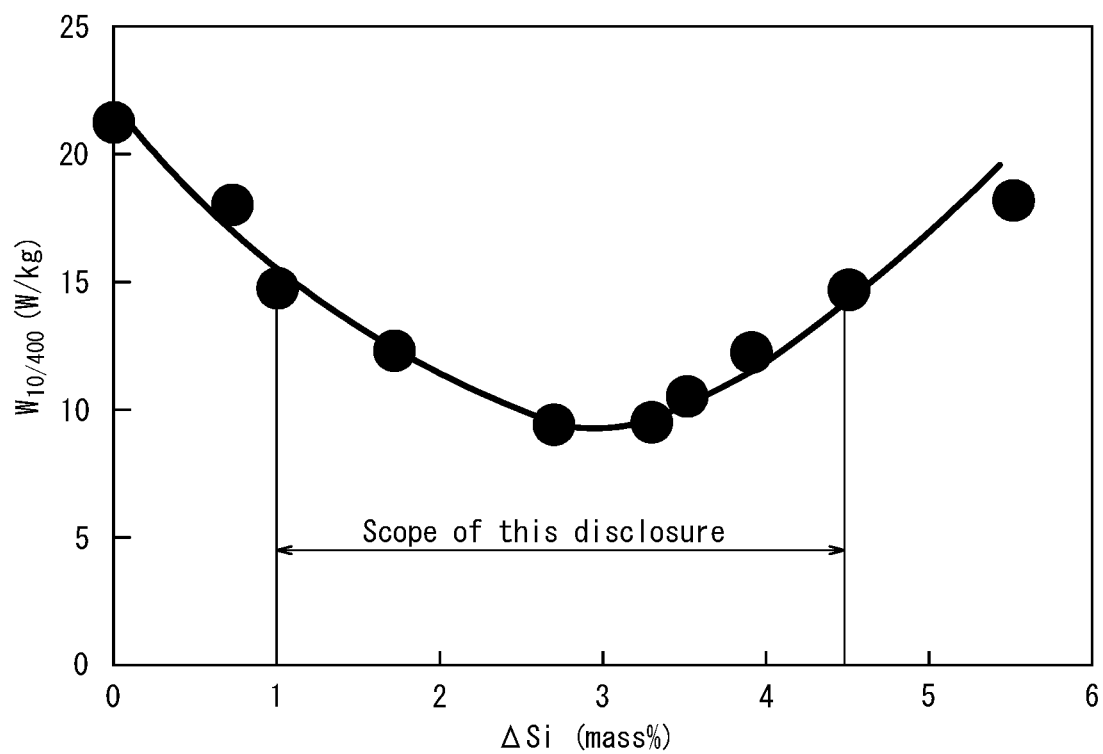
FIG. 3 is a graph illustrating a correlation between the difference in Si content between surface layers and a mid-thickness position (ΔSi) and the iron loss ($W_{10/400}$)

FIG. 3 indicates a correlation between ΔSi (mass %) and the iron loss at 1.0 T and 400 Hz represented by $W_{10/400}$ (W/kg), ΔSi being defined as a difference in Si content between each of the surface layers and the inner layer ($[Si]_1 - [Si]_0$). From the result, it is found that when ΔSi is 1.0 mass % or more and 4.5 mass % or less, the iron loss is significantly reduced. This is believed to be because of the following reasons. Specifically, when the Si content in each of the surface layers is higher than that in the inner layer, the magnetic permeability of each of the surface layers is higher than that of the inner layer. As a result, magnetic fluxes concentrate to the surface layers, lowering eddy current loss. However, when ΔSi is excessively large, the difference in lattice constant and the difference in magnetostriction between each of the surface layers and the inner layer become large. As a result, since the stress applied during the magnetization of the steel sheet is increased, the hysteresis loss increases. From the above, ΔSi is set to 1.0 mass % or more and 4.5 mass % or less in this disclosure. The ΔSi is preferably set to 1.5 mass % or more. The ΔSi is preferably set to 4.0 mass % or less.

[Difference in Mn Content]

In this disclosure, a difference between $[Mn]_0$ and $[Mn]_1$ ($[Mn]_0 - [Mn]_1$) represented by ΔMn is set to 0.01 mass % or more and 0.4 mass % or less, where $[Mn]_0$ denotes a Mn content at a mid-thickness position t/2 and $[Mn]_1$ denotes an average Mn content in a region from a surface of the non-oriented electrical steel sheet to a position at a depth of (1/10)t. $[Mn]_1$ is calculated from the concentration distribution of Mn in the thickness direction of the non-oriented electrical steel sheet, the concentration distribution being obtained by an electron probe micro analyzer (EPMA). The reasons for limiting ΔMn in the above range are described below.

When we were studying to further reduce the iron loss of the non-oriented electrical steel sheet, we found that non-oriented electrical steel sheets manufactured by a siliconizing method had different iron loss. We investigated the reason for this and found that the average Mn content in a surface part of a non-oriented electrical steel sheet (a region from a surface to a position at a depth of (1/10)t) is lower than a Mn content at a mid-thickness position, and that the difference in Mn content between the surface part and the mid-thickness position differs depending on the non-oriented electrical steel sheets.

The decrease in Mn content in the surface part is considered to be caused by the presence of chlorine gas in an atmosphere during the siliconizing treatment. Specifically, the atmosphere used in the siliconizing treatment contains chlorine gas originally contained in source gas and chlorine gas generated by the reaction of silicon tetrachloride used in the siliconizing treatment with Fe in the steel. It is believed that the chlorine gas reacted with Mn present in the surface layer of the steel sheet to form $MnCl_2$ to be volatilized, thereby reducing the Mn content in the surface part.

To examine the effect of the difference in Mn content between the surface part and the mid-thickness position (ΔMn) on the magnetic properties, non-oriented electrical steel sheets having different ΔMn were manufactured by the following procedures to evaluate the magnetic properties.

First, steel slabs having a chemical composition consisting of Si: 2.5%, Mn: 0.50%, Sn: 0.04% with the balance being Fe and inevitable impurities were hot rolled to obtain hot rolled steel sheets. The hot-rolled steel sheets were subjected to hot-rolled sheet annealing of 950° C.×30 s followed by cold rolling to obtain cold-rolled steel sheets with a sheet thickness t: 0.20 mm. Then, the cold-rolled steel sheets were subjected to siliconizing treatment in a $SiCl_4$ atmosphere at different temperatures, followed by diffusion treatment in a nitrogen atmosphere at 1200° C. and cooled at 10° C./s to obtain non-oriented electrical steel sheets. The Si content of each surface layer in each of the obtained non-oriented electrical steel sheets was 4.0%, and the difference in Si content between the inner layer and the surface layer, ΔSi, was 1.5%. The surface layers on both sides had the same chemical composition.

Figure 4:
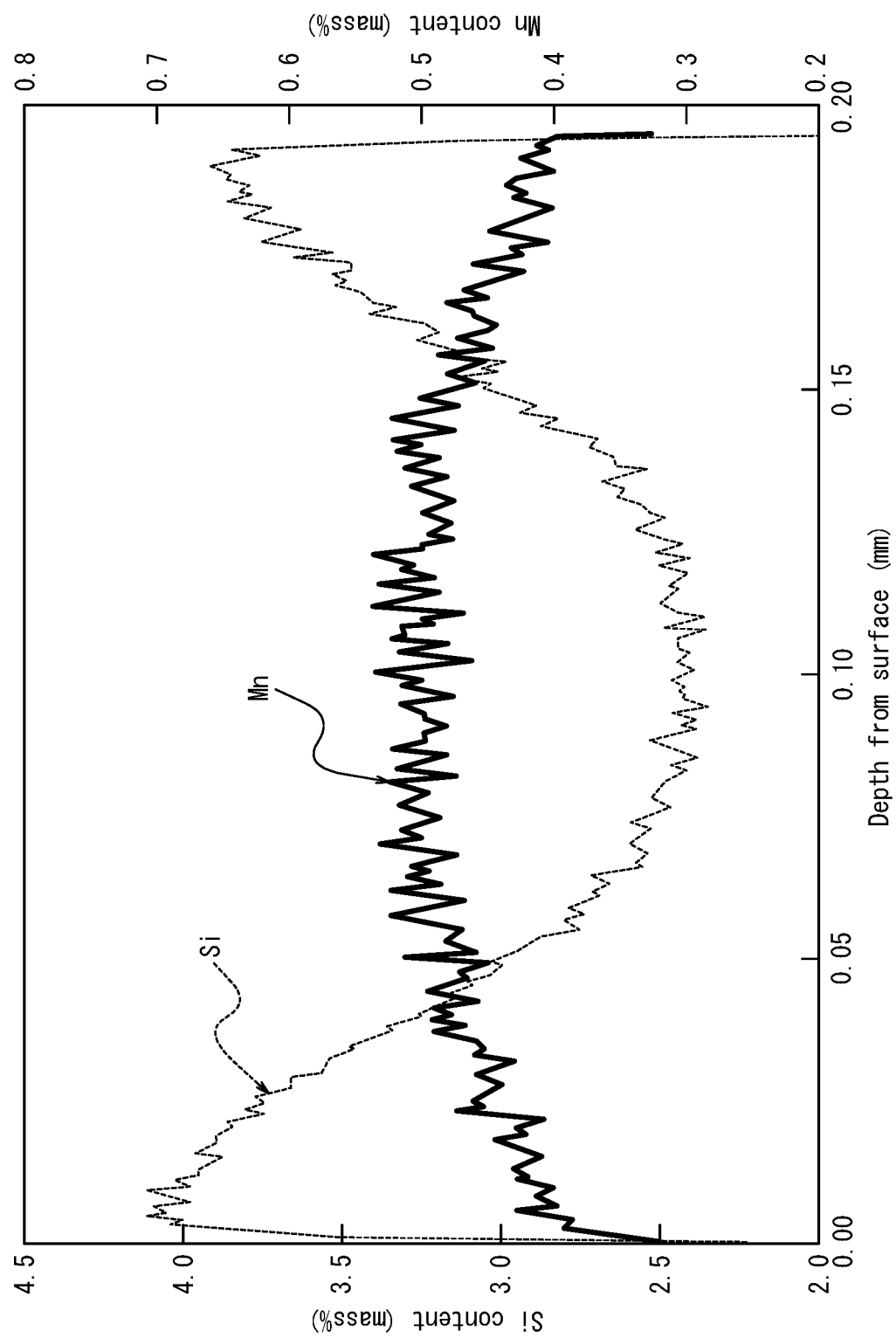
FIG. 4 is a graph illustrating one example of the concentration profiles of Si and Mn in a thickness direction.

As an example, the concentration profiles of Si and Mn of a non-oriented electrical steel sheet with ΔMn=0.10% and ΔSi=1.5% are illustrated in FIG. 4. The concentration profiles were measured by an electron probe micro analyzer (EPMA). As can be seen from FIG. 4, in the obtained non-oriented electrical steel sheet, the Mn content in the surface part was lower than that in the mid-thickness position. This trend was also observed in other non-oriented electrical steel sheets.

Next, test pieces having a width of 30 mm and a length of 180 mm were collected from each of the obtained non-oriented electrical steel sheets and subjected to the Epstein test to evaluate the magnetic properties. In the Epstein test, L-direction test pieces were collected so that the length direction of the test pieces was parallel to the rolling direction (L direction), and C-direction test pieces were collected so that the length direction of the test pieces was parallel to the direction orthogonal to the rolling direction (C direction). The L- and C-direction test pieces were used in equal amounts to measure the averages of the magnetic properties in the L and C directions.

Figure 5:
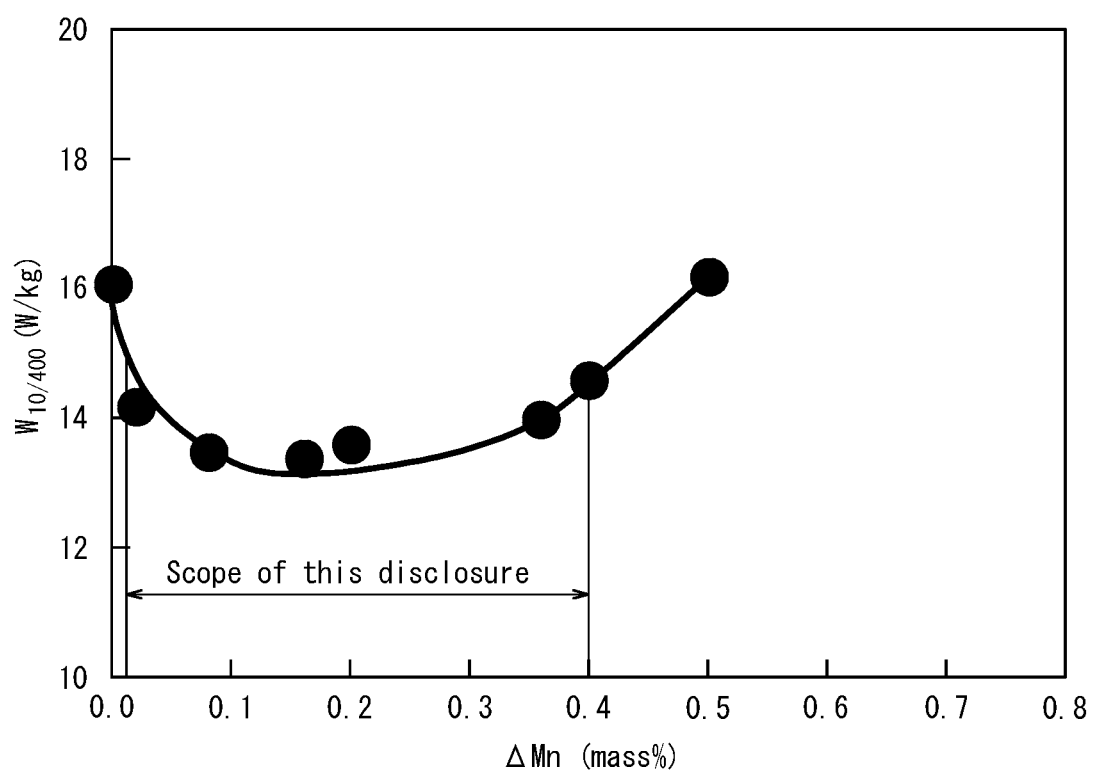
FIG. 5 is a graph illustrating a correlation between the difference in Mn content between surface layers and a mid-thickness position (ΔMn) and the iron loss ($W_{10/400}$)

FIG. 5 illustrates the correlation between ΔMn and the iron loss: $W_{10/400}$ (W/kg) at 1.0 T and 400 Hz. ΔMn is defined as a difference between $[Mn]_0$ and $[Mn]_1$ ($[Mn]_0 - [Mn]_1$), where $[Mn]_0$ denotes a Mn content at a mid-thickness position t/2 and $[Mn]_1$ denotes an average Mn content in a region from a surface to a position at a depth of 10% or less of t of the non-oriented electrical steel sheet.

As can be seen from the result illustrated in FIG. 5, when ΔMn is 0.01 mass % or more and 0.40 mass % or less, the iron loss is significantly reduced. This is believed to be because of the following reasons. Specifically, by lowering the Mn content in the surface part compared to the mid-thickness position, the magnetic permeability of the surface layer becomes higher than that at the mid-thickness position. As a result, magnetic fluxes concentrate to the surface layer, lowering eddy current loss. However, when ΔMn is excessively large, the difference in lattice constant between the surface part and the mid-thickness position becomes large. It is believed that, as a result, the stress generated inside the steel sheet increased, thus increasing the hysteresis loss. From the above, ΔMn is set to 0.01 mass % or more and 0.40 mass % or less in this disclosure. The ΔMn is preferably set to 0.05 mass % or more. Further, the ΔMn is preferably set to 0.35 mass % or less.

[Multilayer Ratio]

To examine the effect of the ratio of the total thickness of the surface layers $t_1$ to the sheet thickness of the non-oriented electrical steel sheet t ($t_1$/t) (hereinafter, also referred to as "multilayer ratio") on the magnetic properties, non-oriented electrical steel sheets having different multilayer ratios of from 0.05 to 0.8 were manufactured by the following procedures to evaluate the magnetic properties. The "total thickness of the surface layers" indicates the sum of the thicknesses of the surface layers provided on both sides of the non-oriented electrical steel sheet.

First, steel slabs having a chemical composition consisting of Si: 2.0%, Mn: 0.18%, Sn: 0.04% with the balance being Fe and inevitable impurities were hot rolled to obtain hot rolled steel sheets. The hot-rolled steel sheets were subjected to hot-rolled sheet annealing of 950° C.×30 s followed by cold rolling to obtain cold-rolled steel sheets with a sheet thickness t: 0.20 mm. Then, the cold-rolled steel sheets were subjected to siliconizing treatment in a $SiCl_4$ atmosphere at a temperature of 1280° C., followed by diffusion treatment in a nitrogen atmosphere at 1200° C. and cooled at 10° C./s to obtain non-oriented electrical steel sheets.

The Si content of each surface layer in each of the obtained non-oriented electrical steel sheets was 4.0%, $\Delta$Si was 2.0%, and $\Delta$Mn was 0.10. The surface layers on both sides had the same chemical composition. The $\Delta$Si and the multilayer ratio were controlled by controlling the diffusion treatment time and the flow rate of the $SiCl_4$ gas. For example, when the diffusion treatment time is shortened, $\Delta$Si increases. When the flow rate of the $SiCl_4$ gas is increased, the multilayer ratio increases.

Next, test pieces having a width of 30 mm and a length of 180 mm were collected from each of the obtained non-oriented electrical steel sheets and subjected to the Epstein test to evaluate the magnetic properties. In the Epstein test, L-direction test pieces were collected so that the length direction of the test pieces was parallel to the rolling direction (L direction), and C-direction test pieces were collected so that the length direction of the test pieces was parallel to the direction orthogonal to the rolling direction (C direction). The L- and C-direction test pieces were used in equal amounts to measure the averages of the magnetic properties in the L and C directions.

Figure 6:
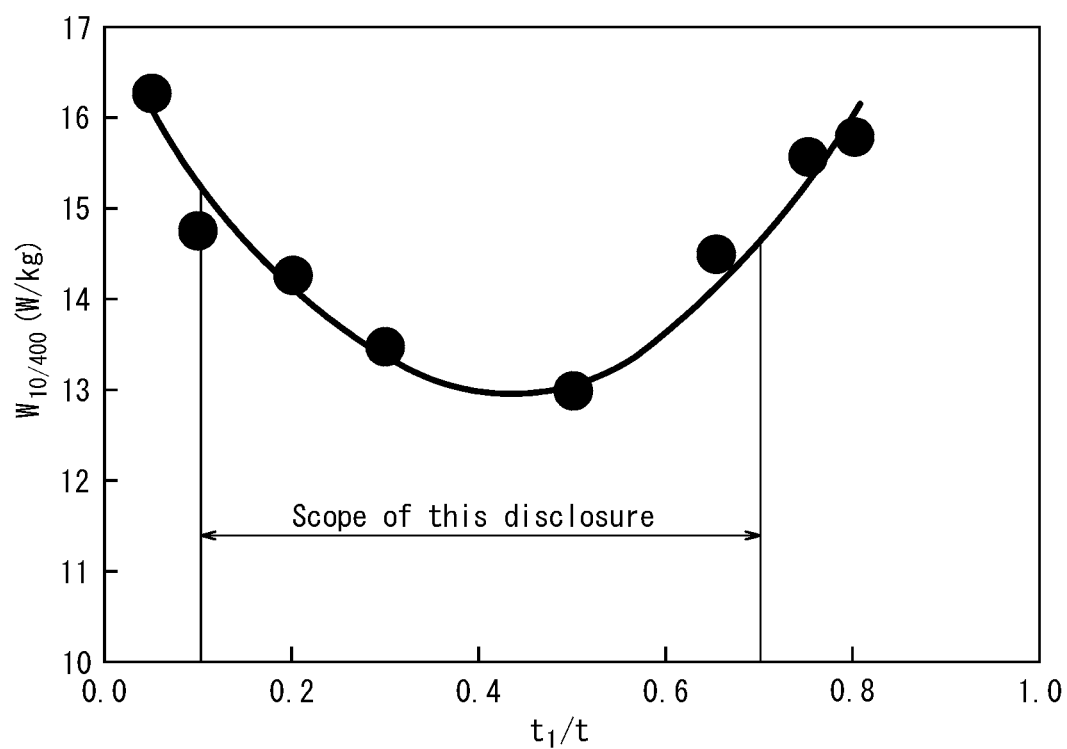
FIG. 6 is a graph illustrating a correlation between the multilayer ratio defined as a ratio of a total thickness of the surface layers $t_1$ to the sheet thickness of the non-oriented electrical steel sheet t and the iron loss ($W_{10/400}$).

FIG. 6 illustrates the correlation between the multilayer ratio: $t_1/t$ and the iron loss: $W_{10/400}$ (W/kg) at 1.0 T and 400 Hz. From the result, it is found that when the multilayer ratio is from 0.10 to 0.70, the iron loss is significantly reduced. The reduction in the iron loss is believed to be because of the following reasons. First, when the multilayer ratio is less than 0.10, the ratio of the surface layers which have high resistance is low and thus the eddy current which concentrates on the surface layers cannot be effectively reduced. On the other hand, since the difference in magnetic permeability between the surface layers and the inner layer is small when the multilayer ratio is more than 0.70, the magnetic flux penetrates to the inner surface and the eddy current loss also occurs from the inner surface. Therefore, the iron loss can be reduced by setting the multilayer ratio to 0.10 or more and 0.70 or less. For the above reasons, the multilayer ratio in this disclosure is set to 0.10 or more and 0.70 or less. The multilayer ratio is preferably set to 0.20 or more. Further, the multilayer ratio is preferably set to 0.60 or less.

[Texture]

By adding an appropriate amount of at least one of the segregation elements P, Sn and Sb, and increasing the {100} plane and decreasing the {111} plane in the non-oriented electrical steel sheet, magnetization tends to be generated in the plane of the non-oriented electrical steel sheet. And as a result, the magnetic flux density is improved and the hysteresis loss is further reduced. Therefore, from the viewpoint of further improving the magnetic properties, it is preferable set the ratio of the accumulation degree of {100} planes to the accumulation degree of {111} planes represented by {100}/{111} to 0.55 or more. In addition, when the {100}/{111} is excessively large, the formability of a core may be reduced. Therefore, from the viewpoint of improving the formability, it is preferable to set {100}/{111} to 0.90 or less. As used herein, {100}/{111} is defined as a ratio of the accumulation degree of {100} planes to the accumulation degree of {111} planes in a section of an orientation distribution function (ODF) at $\Phi_2=45°$ in a plane at a depth of ¼ of the sheet thickness from a surface of the non-oriented electrical steel sheet.

[Manufacturing Method]

The method of manufacturing the non-oriented electrical steel sheet of this disclosure is not particularly limited and may be any method. The following describes a method example for manufacturing a non-oriented electrical steel sheet according to this disclosure.

[Siliconizing and Diffusion Treatment Process]

In one embodiment of this disclosure, the non-oriented electrical steel sheet can be manufactured by siliconizing and diffusion treatment. Specifically, first, a steel sheet having a chemical composition consisting of Si, Mn, and at least one selected from the group consisting of P, Sn, and Sb with the balance being Fe and inevitable impurities is subjected to siliconizing treatment. In the siliconizing treatment, for example, Si is deposited on a surface of the steel sheet by a chemical vapor deposition (CVD) method. In the siliconizing treatment by the CVD method, Si-containing gas such as silicon tetrachloride is used as a Si source. The siliconizing treatment is performed at a predetermined siliconizing treatment temperature for a predetermined siliconizing treatment time. The steel sheet used for the siliconizing treatment may be an ordinary steel sheet having a substantially uniform chemical composition in the thickness direction.

After the siliconizing treatment, the supply of the Si-containing gas is stopped and diffusion treatment is performed in a nitrogen gas atmosphere. In the diffusion treatment, the steel sheet subjected to the siliconizing treatment may be held at a predetermined diffusion treatment temperature for a predetermined diffusion treatment time. By the diffusion treatment, Si deposited on the surface of the steel sheet diffuses into the steel sheet.

The Si content in the surface layers of the steel sheet can be increased by the above siliconizing and diffusion treatment. The non-oriented electrical steel sheet obtained by the siliconizing and diffusion treatment has, for example, a Si content profile as illustrated in FIG. 2A.

On the other hand, the Mn content in the surface layers of the steel sheet is reduced by the siliconizing treatment. It is believed that this is because, as described above, Mn present in the surface layers of the steel sheet reacts with chlorine derived from the gas used in the siliconizing treatment to be volatilized. By performing the diffusion treatment after the Mn content in the surface layers is reduced by the siliconizing treatment, Mn is diffused from the inner layer to the surface layers.

The siliconizing and diffusion treatment can be basically performed in accordance with the conventional method. In that case, the amount of Si deposited, the treatment temperature, and the treatment time in the siliconizing treatment and diffusion treatment may be controlled so that the Si content of the surface layers, $\Delta$Si, $\Delta$Mn, and the multilayer ratio of the finally obtained non-oriented electrical steel sheet are desired values.

From the viewpoint of reducing the treatment time, the siliconizing treatment can be performed at a siliconizing treatment temperature of 1250° C. or higher. However, when the temperature of the siliconizing treatment is 1250° C. or higher, the siliconizing treatment is performed at a temperature close to the melting point of the steel sheet, which may cause the steel sheet to melt and fracture. Therefore, from the viewpoint of preventing the fracture of the steel sheet, it is preferable to set the siliconizing treatment temperature to lower than 1250° C. On the other hand, when the siliconizing treatment temperature is excessively low, the productivity is reduced. Therefore, from the viewpoint of improving productivity, the siliconizing treatment temperature is preferably set to 1000° C. or higher.

Under the manufacturing conditions of the non-oriented electrical steel sheet of this disclosure, the diffusion rate of Si is faster than that of Mn. This is because the diffusion coefficient of Si is larger than that of Mn, and in addition, the concentration gradient of Si in the thickness direction is larger than that of Mn. Therefore, the diffusion treatment temperature and the diffusion treatment time may be adjusted to mainly obtain desired ΔSi and multilayer ratio. In this case, when the diffusion treatment temperature is excessively low, the productivity is reduced. Therefore, from the viewpoint of improving the productivity, the diffusion treatment temperature is preferably set to 880° C. or higher. On the other hand, when the diffusion treatment temperature is too close to the melting point of the steel sheet, the steel sheet may melt and fracture. Therefore, from the viewpoint of preventing the fracture of the steel sheet, the diffusion treatment temperature is preferably set to lower than 1250° C.

On the other hand, even in the cooling process after the diffusion treatment, elements are diffused in a relatively high temperature range. In particular, in the non-oriented electrical steel sheet of this disclosure, because the Mn content and ΔMn must be controlled within ranges which are one or more orders of magnitude smaller than those of the Si content and ΔSi, it is important to control the cooling rate after the diffusion treatment in order to obtain the desired ΔMn.

Specifically, in the cooling process after the completion of the diffusion treatment, the cooling rate in a temperature range of from the diffusion treatment temperature to 880° C. is set to 10° C./s or more. When the cooling rate is less than 10° C./s, the residence time in a high temperature range during the cooling process is longer, and thus the diffusion of Mn from the inner layer to the surface layers becomes significant. And as a result, it becomes difficult to ensure the desired ΔMn. In particular, when the siliconizing treatment is performed at a relatively low siliconizing treatment temperature of lower than 1250° C., the cooling rate in a range of from the diffusion treatment temperature to 880° C. is set to 17° C./s or more to achieve the desired ΔMn because the demanganization of the surface layers during the siliconizing treatment is suppressed. On the other hand, when the cooling rate is excessively fast, cooling strain may occur, resulting in an increase in hysteresis loss. Therefore, from the viewpoint of suppressing the increase in hysteresis loss caused by the cooling strain, the cooling rate in a range of from the diffusion treatment temperature to 880° C. is preferably set to 30° C./s or less.

(Cladding Method)

Another manufacturing method is a method of cladding steel raw materials having different Si and Mn contents. The chemical compositions of the steel raw materials can be adjusted by, for example, blowing materials having different compositions in a converter to obtain molten steel and subjecting the molten steel to degassing treatment.

The cladding method is not particularly limited. However, for example, steel slabs having different Si and Mn contents may be prepared and a steel slab for the surface layers may be stacked with a thickness to provide an eventual multilayer ratio of a desired value to both surfaces of a steel slab for the inner layer and subjected to rolling. The rolling may be, for example, at least one selected from the group consisting of hot rolling, warm rolling, and cold rolling. In general, the combination of hot rolling and subsequent warm rolling or the combination of hot rolling and subsequent cold rolling is preferable. After the hot rolling, hot-rolled sheet annealing is preferably performed. Further, the warm rolling and cold rolling may be performed twice or more with intermediate annealing performed therebetween. The rolling finish temperature and the coiling temperature during the hot rolling are not particularly limited and may be determined according to the conventional method. After the rolling, final annealing is performed. The non-oriented electrical steel sheet obtained by cladding the steel raw materials having different Si contents has the Si content profile as illustrated in, for example, FIG. 2B.

EXAMPLES

To confirm the effect of this disclosure, non-oriented electrical steel sheets were manufactured in the following procedures to evaluate their magnetic properties.

First, steel slabs with the chemical compositions listed in Table 1 were prepared. The chemical compositions of the steel slabs were adjusted by blowing the steel slabs in a converter and subsequently subjecting them to degassing treatment. As described below, the chemical composition at a mid-thickness position of an eventually obtained non-oriented electrical steel sheet was the same as that of the corresponding steel slab.

The steel slabs were then heated at 1140° C. for 1 hour and then hot rolled to obtain hot rolled steel sheets having a sheet thickness of 2 mm. The hot rolling finish temperature in the hot rolling was set to 800° C. The hot-rolled steel sheets were coiled at a coiling temperature of 610° C., and then subjected to hot-rolled sheet annealing of 900° C.×30 s. Acid cleaning and cold rolling were then performed.

Thereafter, the steel sheets after cold rolling were subjected to a siliconizing and diffusion treatment to obtain non-oriented electrical steel sheets. In the siliconizing and diffusion treatment, siliconizing treatment was firstly performed in a $SiCl_4$ atmosphere at the siliconizing treatment times and siliconizing treatment temperatures listed in Table 1. Then, the diffusion treatment was performed at a diffusion treatment temperature of 1200° C. in an $N_2$ atmosphere, followed by cooling. In the cooling, the average cooling rate in the temperature range of from the diffusion treatment temperature to 880° C. was as listed in Table 1.

The non-oriented electrical steel sheet of Example No. 47 was manufactured using a cladding method instead of the siliconizing treatment. Specifically, a steel slab for the surface layers having the chemical composition listed as No. 47a in Table 1 and a steel slab for the inner layer having the component concentration listed as No. 47b were prepared. The steel slab for the surface layers and the steel slab for the inner layer were rough rolled until a thickness which provides a final multilayer ratio of 0.25 was obtained. Then, a steel slab for the surface layers was welded to both sides of the steel slab for the inner layer to make a clad slab. The welding was performed using an electron beam in vacuum. The clad slab was then heated at 1140° C. for 1 hour and hot rolled to obtain a hot rolled steel sheet having a sheet thickness of 2 mm. The hot rolling finish temperature in the hot rolling was set to 800° C. The hot-rolled steel sheet was coiled at a coiling temperature of 610° C. and then subjected to hot-rolled sheet annealing of 900° C.×30 s. Acid cleaning and cold rolling were then performed to obtain a cold-rolled steel sheet having a sheet thickness of 0.20 mm. The cold-rolled steel sheet was subjected to final annealing of 1100° C.×30 seconds under an atmosphere of $N_2:H_2=80:20$ to obtain a non-oriented electrical steel sheet.

(Si Content)

Each obtained non-oriented electrical steel sheet was embedded in a carbon mold, and the Si content distribution in a cross section in a thickness direction was measured using an electron probe micro analyzer (EPMA). The average of Si contents over the total sheet thickness of the steel sheet was calculated. A part having a higher Si concentration than the average was defined as a surface layer and a part having a lower Si concentration than the average was defined as an inner layer. From the result obtained, the average Si content in the surface layers, $[Si]_1$, and the Si content in the inner layer, $[Si]_0$, were determined. The Si content in the inner layer $[Si]_0$ was the same as the Si content in the corresponding slab before the siliconizing treatment. From the obtained $[Si]_1$ and $[Si]_0$, ΔSi defined as ($[Si]_1-[Si]_0$) was calculated. In the measurement using EPMA, the Si content was calculated from measured strength based on the measurement result of the steel slab before the siliconizing treatment in which the Si content was known.

(Amount of Mn)

The measurement using EPMA was performed in the same procedure as the measurement of ΔSi, and the distribution of Mn content in a cross section in the thickness direction was obtained. From the results obtained, the following values were calculated:

average Mn content in the surface layers;

average Mn content in the inner layer;

Mn content at a mid-thickness position t/2: $[Mn]_0$; and average Mn content in a region from a surface of the steel sheet to a position at a depth of (1/10)t: $[Mn]_1$.

From the obtained $[Mn]_1$ and $[Mn]_0$, ΔMn defined as ($[Mn]_1-[Mn]_0$) was calculated. The Mn content at the mid-thickness position: $[Mn]_0$ was the same as the Mn content in the corresponding slab before the siliconizing treatment. As mentioned above, the surface layers are defined as a part having a higher Si concentration than the average of Si contents over the total sheet thickness and the inner layer is defined as a part having a lower Si concentration than the average of Si contents over the total sheet thickness.

The measured Si contents and Mn contents in the non-oriented electrical steel sheets after the siliconizing treatment are listed in Table 2. The concentrations of the elements other than Si and Mn were not changed by the siliconizing treatment. In other words, the contents of the elements other than Si and Mn in the surface layers and inner layer of the obtained non-oriented electrical steel sheets were the same as those in the steel slabs used.

The multilayer ratio of $t_1$ to t represented by $t_1/t$ is as listed in Table 2, where $t_1$ denotes the total thickness of the surface layers determined from the Si distribution and t denotes the sheet thickness of each of the eventually obtained non-oriented electrical steel sheets.

(Magnetic Properties)

Then, magnetic properties were measured for each of the obtained non-oriented electrical steel sheets. The measurement was performed using a 25 cm Epstein frame in accordance with JIS C 2550-1. As the magnetic properties, measured were iron loss at 1.0 T and 400 Hz: $W_{10/400}$ (W/kg), iron loss at 1.0 T and 1 kHz: $W_{10/1k}$ (W/kg), iron loss at 1.0 T and 2 kHz: $W_{10/2k}$ (W/kg), and magnetic flux density at a magnetic field strength of 5000 A/m: $B_{50}$. The measurement results are listed in Table 3.

The magnetic properties required for non-oriented electrical steel sheets depend on the sheet thickness and Si content. Therefore, when the iron loss at each frequency satisfies the conditions specified in the corresponding formula of (1) to (3) below, the iron loss at the frequency was judged as good, $$W_{10/400} \leq 19-0.3/t-0.6[Si] \qquad (1)$$

$$W_{10/1k} \leq 55-0.4/t-2[Si] \qquad (2)$$

$$W_{10/2k} \leq 140-0.9/t-5[Si] \qquad (3)$$

where t: sheet thickness, $t_1$: total thickness of the surface layers, and [Si]: average of Si contents in total sheet thickness.

Although the frequency range in which iron loss must be low varies depending on the operating conditions of a motor, in this disclosure, the high-frequency iron loss of the final non-oriented electrical steel sheet was evaluated based on the following judgment criteria:

when the conditions of the formulas (1) to (3) are not satisfied: Poor;

when the conditions of the formulas (1) and (2) are satisfied: Good; and when the conditions of the formulas (1) to (3) are satisfied: Excellent.

(Texture)

In order to examine the texture of each of the obtained non-oriented electrical steel sheets, {100}/{111} was measured in a section of an orientation distribution function at $\Phi_2=45°$ in a plane at a depth of ¼ of the sheet thickness from a surface of the non-oriented electrical steel sheet, {100}/{111} representing the ratio of an accumulation degree of {100} planes to an accumulation degree of {111} planes. Specifically, the non-oriented electrical steel sheet was chemically polished up to a position of ¼ of the sheet thickness from a steel sheet surface and subjected to oriental distribution function (ODF) analysis using X-rays. The measurement results are also listed in Table 1.

As can be seen from the results listed in Table 1, the non-oriented electrical steel sheets satisfying the conditions of this disclosure had excellent magnetic properties. Specifically, the iron loss was evaluated as good or excellent and the magnetic flux density: $B_{50}$ was 1.59 T or more. In Comparative Example No. 6, the steel sheet was fractured during annealing in manufacturing and thus subsequent evaluation could not be performed. In Comparative Examples Nos. 34 to 36, the steel sheets were fractured during cold rolling and thus subsequent evaluation could not be performed.

TABLE 1

| | Chemical composition of steel slab (mass %)* | | | | | Siliconizing treatment conditions | | |
| | | | | | | Siliconizing treatment time | Siliconizing treatment temperature | Cooling rate* |
| No. | Si | Mn | P | Sn | Sb | Others | (s) | (° C.) | (° C./s) |
|---|---|---|---|---|---|---|---|---|---|
| 1 | 2.5 | 0.20 | 0.040 | 0.040 | 0.001 | — | 40 | 1300 | 10 |
| 2 | 2.5 | 0.20 | 0.040 | 0.040 | 0.001 | — | 37 | 1300 | 10 |
| 3 | 2.5 | 0.20 | 0.040 | 0.040 | 0.001 | — | 30 | 1300 | 10 |
| 4 | 2.5 | 0.20 | 0.040 | 0.040 | 0.001 | — | 27 | 1300 | 10 |
| 5 | 2.5 | 0.20 | 0.040 | 0.040 | 0.001 | — | 25 | 1300 | 10 |
| 6 | 4.5 | 0.20 | 0.010 | 0.020 | — | — | 35 | 1250 | 10 |
| 7 | 5.0 | 0.20 | 0.010 | 0.020 | — | — | 28 | 1250 | 10 |
| 8 | 4.0 | 0.20 | 0.020 | 0.010 | — | — | 30 | 1250 | 10 |
| 9 | 4.0 | 0.20 | 0.100 | — | 0.050 | — | 31 | 1280 | 10 |
| 10 | 4.0 | 0.20 | — | 0.100 | 0.050 | — | 24 | 1280 | 10 |
| 11 | 4.5 | 0.10 | 0.050 | 0.060 | 0.010 | — | 34 | 1250 | 10 |
| 12 | 4.5 | 0.10 | — | 0.050 | 0.021 | — | 33 | 1250 | 10 |
| 13 | 4.3 | 0.25 | 0.070 | 0.030 | 0.030 | — | 32 | 1250 | 10 |
| 14 | 4.0 | 0.10 | — | 0.040 | 0.060 | — | 33 | 1250 | 10 |
| 15 | 4.0 | 0.10 | 0.060 | 0.040 | — | — | 32 | 1250 | 10 |
| 16 | 4.0 | 0.10 | 0.060 | 0.040 | 0.050 | — | 24 | 1250 | 10 |
| 17 | 3.0 | 0.50 | 0.010 | 0.100 | 0.010 | — | 15 | 1270 | 10 |
| 18 | 3.0 | 0.50 | 0.010 | 0.010 | — | — | 12 | 1270 | 10 |
| 19 | 3.5 | 0.50 | 0.030 | 0.080 | — | — | 13 | 1260 | 10 |
| 20 | 3.5 | 0.40 | — | 0.080 | — | — | 14 | 1350 | 10 |
| 21 | 2.5 | 0.30 | 0.050 | — | — | — | 12 | 1340 | 10 |
| 22 | 2.5 | 0.30 | — | — | 0.100 | — | 13 | 1340 | 10 |
| 23 | 3.2 | 0.05 | 0.030 | 0.030 | 0.030 | — | 14 | 1230 | 10 |
| 24 | 4.3 | 0.30 | — | — | — | — | 11 | 1350 | 10 |
| 25 | 2.5 | 0.35 | 0.050 | 0.001 | 0.050 | — | 20 | 1350 | 10 |
| 26 | 2.2 | 0.12 | 0.050 | 0.001 | 0.001 | — | 34 | 1250 | 10 |
| 27 | 4.0 | 0.10 | 0.050 | 0.050 | 0.030 | — | 20 | 1270 | 10 |
| 28 | 4.0 | 0.40 | 0.070 | 0.100 | — | — | 17 | 1290 | 10 |
| 29 | 1.5 | 0.08 | 0.050 | 0.030 | 0.080 | — | 8 | 1260 | 10 |
| 30 | 2.0 | 0.10 | 0.010 | 0.010 | 0.010 | — | 54 | 1250 | 10 |
| 31 | 3.5 | 0.45 | — | 0.040 | 0.020 | — | 43 | 1250 | 10 |
| 32 | 2.3 | 0.40 | 0.020 | 0.020 | 0.020 | — | 7 | 1330 | 10 |
| 33 | 4.0 | 0.30 | 0.020 | — | — | — | 33 | 1270 | 10 |
| 34 | 4.0 | 0.50 | — | 0.500 | 0.040 | — | 33 | 1290 | 10 |
| 35 | 4.6 | 0.15 | 0.500 | 0.010 | 0.010 | — | 29 | 1260 | 10 |
| 36 | 4.2 | 0.38 | 0.030 | 0.030 | 0.300 | — | 30 | 1330 | 10 |
| 37 | 3.0 | 0.60 | 0.040 | 0.080 | — | — | 42 | 1330 | 10 |
| 38 | 2.0 | 0.50 | 0.018 | 0.008 | 0.007 | — | 62 | 1300 | 10 |
| 39 | 2.5 | 0.20 | 0.020 | 0.040 | — | — | 20 | 1270 | 5 |
| 40 | 2.5 | 0.40 | 0.020 | 0.040 | — | — | 20 | 1200 | 17 |
| 41 | 2.5 | 0.40 | 0.020 | 0.040 | — | — | 20 | 1200 | 10 |
| 42 | 2.5 | 0.30 | 0.011 | 0.011 | — | Al: 0.0036 | 25 | 1270 | 10 |
| 43 | 2.6 | 0.30 | 0.012 | 0.010 | — | Ti: 0.0024 | 22 | 1270 | 10 |
| 44 | 2.5 | 0.32 | 0.010 | 0.011 | — | Nb: 0.0028 | 25 | 1270 | 10 |
| 45 | 2.5 | 0.31 | 0.011 | 0.010 | — | V: 0.0025 | 25 | 1270 | 10 |
| 46 | 2.4 | 0.30 | 0.010 | 0.010 | — | Zr: 0.0021 | 27 | 1270 | 10 |
| 47a | 4.5 | 0.10 | — | 0.040 | — | — | — | — | — |
| 47b | 2.5 | 0.40 | — | 0.040 | — | — | — | — | — |

*Cooling rate in a temperature range of from the diffusion treatment temperature (1200° C.) to 880° C.

TABLE 2

| | Chemical composition after siliconizing treatment (mass %) | | | | | | | | Sheet thickness t | Multilayer ratio |
| No. | Surface layer $[Si]_1$ | Inner layer $[Si]_0$ | ΔSi | Surface layer Mn | Inner layer Mn | $[Mn]_0$ | $[Mn]_1$ | ΔMn | (mm) | $t_1/t$ |
|---|---|---|---|---|---|---|---|---|---|---|
| 1 | 6.0 | 2.5 | 3.5 | 0.02 | 0.19 | 0.20 | 0.02 | 0.18 | 0.20 | 0.25 |
| 2 | 5.5 | 2.5 | 3.0 | 0.02 | 0.19 | 0.20 | 0.02 | 0.18 | 0.20 | 0.25 |
| 3 | 4.5 | 2.5 | 2.0 | 0.06 | 0.19 | 0.20 | 0.06 | 0.14 | 0.20 | 0.25 |
| 4 | 4.0 | 2.5 | 1.5 | 0.15 | 0.19 | 0.20 | 0.14 | 0.06 | 0.20 | 0.25 |
| 5 | 3.5 | 2.5 | 1.0 | 0.02 | 0.19 | 0.20 | 0.02 | 0.18 | 0.20 | 0.25 |
| 6 | 7.5 | 4.5 | 3.0 | 0.11 | 0.19 | 0.20 | 0.10 | 0.10 | — | — |
| 7 | 6.4 | 5.0 | 1.5 | 0.11 | 0.19 | 0.20 | 0.10 | 0.10 | 0.20 | 0.25 |
| 8 | 5.5 | 4.0 | 1.5 | 0.11 | 0.19 | 0.20 | 0.10 | 0.10 | 0.20 | 0.25 |
| 9 | 6.0 | 4.0 | 2.0 | 0.05 | 0.19 | 0.20 | 0.05 | 0.15 | 0.20 | 0.25 |
| 10 | 5.0 | 4.0 | 1.0 | 0.05 | 0.19 | 0.20 | 0.05 | 0.15 | 0.20 | 0.50 |
| 11 | 7.0 | 4.5 | 2.5 | 0.01 | 0.10 | 0.10 | 0.01 | 0.09 | 0.20 | 0.25 |

TABLE 2-continued

| | Chemical composition after siliconizing treatment (mass %) | | | | | | | | Sheet thickness t (mm) | Multilayer ratio $t_1/t$ |
|---|---|---|---|---|---|---|---|---|---|---|
| No. | Surface layer $[Si]_1$ | Inner layer $[Si]_0$ | ΔSi | Surface layer Mn | Inner layer Mn | $[Mn]_0$ | $[Mn]_1$ | ΔMn | | |
| 12 | 7.0 | 4.5 | 2.5 | 0.01 | 0.10 | 0.10 | 0.01 | 0.09 | 0.20 | 0.25 |
| 13 | 6.1 | 4.3 | 1.8 | 0.21 | 0.24 | 0.25 | 0.20 | 0.05 | 0.20 | 0.25 |
| 14 | 6.0 | 4.0 | 2.0 | 0.01 | 0.10 | 0.10 | 0.01 | 0.09 | 0.10 | 0.25 |
| 15 | 6.0 | 4.0 | 2.0 | 0.01 | 0.10 | 0.10 | 0.01 | 0.09 | 0.07 | 0.25 |
| 16 | 5.5 | 4.0 | 1.5 | 0.01 | 0.10 | 0.10 | 0.01 | 0.09 | 0.25 | 0.25 |
| 17 | 4.5 | 3.0 | 1.5 | 0.32 | 0.48 | 0.50 | 0.30 | 0.20 | 0.20 | 0.25 |
| 18 | 4.0 | 3.0 | 1.0 | 0.42 | 0.48 | 0.50 | 0.40 | 0.10 | 0.20 | 0.25 |
| 19 | 4.5 | 3.5 | 1.0 | 0.42 | 0.48 | 0.50 | 0.40 | 0.10 | 0.20 | 0.25 |
| 20 | 4.5 | 3.5 | 1.0 | 0.03 | 0.38 | 0.40 | 0.03 | 0.37 | 0.20 | 0.25 |
| 21 | 3.5 | 2.5 | 1.0 | 0.03 | 0.29 | 0.30 | 0.03 | 0.27 | 0.20 | 0.25 |
| 22 | 3.5 | 2.5 | 1.0 | 0.03 | 0.29 | 0.30 | 0.03 | 0.27 | 0.20 | 0.25 |
| 23 | 4.4 | 3.2 | 1.2 | 0.01 | 0.05 | 0.05 | 0.01 | 0.04 | 0.20 | 0.25 |
| 24 | 5.6 | 4.3 | 1.3 | 0.08 | 0.29 | 0.30 | 0.08 | 0.22 | 0.20 | 0.25 |
| 25 | 5.0 | 2.5 | 2.5 | 0.16 | 0.33 | 0.35 | 0.15 | 0.20 | 0.20 | 0.25 |
| 26 | 4.8 | 2.2 | 2.6 | 0.06 | 0.11 | 0.12 | 0.06 | 0.06 | 0.20 | 0.25 |
| 27 | 5.0 | 4.0 | 1.0 | 0.01 | 0.10 | 0.10 | 0.01 | 0.09 | 0.20 | 0.25 |
| 28 | 5.0 | 4.0 | 1.0 | 0.26 | 0.38 | 0.40 | 0.20 | 0.20 | 0.20 | <u>0.04</u> |
| 29 | 2.5 | 1.5 | 1.0 | 0.06 | 0.08 | 0.08 | 0.06 | 0.02 | 0.20 | 0.25 |
| 30 | 6.5 | 2.0 | 4.5 | 0.02 | 0.10 | 0.10 | 0.02 | 0.08 | 0.20 | 0.25 |
| 31 | 6.7 | 3.5 | 3.2 | 0.05 | 0.43 | 0.45 | 0.05 | 0.40 | 0.20 | 0.25 |
| 32 | 3.1 | 2.3 | 0.8 | 0.26 | 0.38 | 0.40 | 0.25 | 0.15 | 0.20 | 0.25 |
| 33 | 6.8 | 4.0 | <u>2.8</u> | 0.11 | 0.29 | 0.30 | 0.10 | 0.20 | 0.20 | 0.25 |
| 34 | 6.0 | 4.0 | 2.0 | 0.21 | 0.48 | 0.50 | 0.20 | 0.30 | — | — |
| 35 | 6.6 | 4.6 | 2.0 | 0.11 | 0.14 | 0.15 | 0.10 | 0.05 | — | — |
| 36 | 6.2 | 4.2 | 2.0 | 0.11 | 0.36 | 0.38 | 0.10 | 0.28 | — | — |
| 37 | 5.6 | 3.0 | 2.6 | 0.26 | 0.57 | <u>0.60</u> | 0.25 | 0.35 | 0.20 | 0.25 |
| 38 | 7.0 | 2.0 | <u>5.0</u> | 0.02 | 0.48 | <u>0.50</u> | 0.02 | <u>0.48</u> | 0.20 | 0.20 |
| 39 | 4.5 | 2.5 | <u>2.0</u> | 0.18 | 0.18 | 0.18 | 0.18 | <u>0.00</u> | 0.20 | 0.25 |
| 40 | 4.5 | 2.5 | 2.0 | 0.08 | 0.38 | 0.40 | 0.08 | <u>0.32</u> | 0.20 | 0.25 |
| 41 | 4.5 | 2.5 | 2.0 | 0.31 | 0.31 | 0.31 | 0.31 | <u>0.00</u> | 0.20 | 0.25 |
| 42 | 4.5 | 2.5 | 2.0 | 0.01 | 0.29 | 0.30 | 0.01 | <u>0.29</u> | 0.20 | 0.25 |
| 43 | 4.5 | 2.6 | 1.9 | 0.01 | 0.29 | 0.30 | 0.01 | 0.29 | 0.20 | 0.25 |
| 44 | 4.5 | 2.5 | 2.0 | 0.02 | 0.30 | 0.32 | 0.02 | 0.30 | 0.20 | 0.25 |
| 45 | 4.5 | 2.5 | 2.0 | 0.02 | 0.29 | 0.31 | 0.02 | 0.29 | 0.20 | 0.25 |
| 46 | 4.5 | 2.4 | 2.1 | 0.02 | 0.29 | 0.30 | 0.02 | 0.28 | 0.20 | 0.25 |
| 47a 47b | 4.5 | 2.5 | 2.0 | 0.10 | 0.40 | 0.40 | 0.10 | 0.30 | 0.20 | 0.25 |

TABLE 3

| | | Magnetic properties | | | | | |
|---|---|---|---|---|---|---|---|
| No. | Texture {100}/{111} | $W_{10/400}$ (W/kg) | $W_{10/1k}$ (W/kg) | $W_{10/2k}$ (W/kg) | Evaluation of iron loss | B50 (T) | Remarks |
| 1 | 0.72 | 10.2 | 40.5 | 73.9 | Excellent | 1.61 | Example |
| 2 | 0.69 | 12.0 | 40.4 | 84.6 | Excellent | 1.60 | Example |
| 3 | 0.86 | 13.2 | 41.2 | 101.1 | Excellent | 1.63 | Example |
| 4 | 0.77 | 13.0 | 40.4 | 106.9 | Excellent | 1.62 | Example |
| 5 | 0.64 | 14.1 | 40.3 | 111.0 | Excellent | 1.60 | Example |
| 6 | — | — | — | — | — | — | Comparative Example |
| 7 | 0.63 | 9.4 | 36.5 | 106.9 | Excellent | 1.59 | Example |
| 8 | 0.65 | 9.8 | 38.0 | 106.9 | Excellent | 1.60 | Example |
| 9 | 0.77 | 13.9 | 37.0 | 101.1 | Excellent | 1.62 | Example |
| 10 | 0.88 | 12.1 | 37.4 | 111.0 | Excellent | 1.63 | Example |
| 11 | 0.85 | 10.1 | 35.8 | 93.7 | Excellent | 1.63 | Example |
| 12 | 0.76 | 10.8 | 35.6 | 93.7 | Excellent | 1.61 | Example |
| 13 | 0.67 | 11.8 | 37.5 | 103.7 | Excellent | 1.60 | Example |
| 14 | 0.73 | 9.4 | 35.7 | 91.4 | Excellent | 1.61 | Example |
| 15 | 0.81 | 8.6 | 33.6 | 90.5 | Excellent | 1.62 | Example |
| 16 | 0.85 | 12.3 | 37.4 | 106.0 | Excellent | 1.63 | Example |
| 17 | 0.88 | 9.8 | 41.2 | 106.9 | Excellent | 1.63 | Example |
| 18 | 0.78 | 9.6 | 39.7 | 111.1 | Excellent | 1.62 | Example |
| 19 | 0.89 | 10.2 | 38.7 | 111.1 | Excellent | 1.63 | Example |
| 20 | 0.82 | 10.5 | 40.0 | 110.9 | Excellent | 1.62 | Example |
| 21 | 0.77 | 8.8 | 40.9 | 111.0 | Excellent | 1.62 | Example |
| 22 | 0.61 | 9.9 | 40.7 | 111.0 | Excellent | 1.59 | Example |
| 23 | 0.74 | 11.1 | 39.4 | 128.7 | Good | 1.61 | Example |
| 24 | <u>0.43</u> | 14.4 | 37.2 | 108.7 | Excellent | 1.56 | Comparative Example |
| 25 | <u>0.59</u> | 12.1 | 41.7 | 93.7 | Excellent | 1.59 | Example |
| 26 | 0.74 | 10.1 | 41.0 | 92.1 | Excellent | 1.61 | Example |

TABLE 3-continued

| | | | | Magnetic properties | | | |
|---|---|---|---|---|---|---|---|
| No. | Texture {100}/{111} | $W_{10/400}$ (W/kg) | $W_{10/1k}$ (W/kg) | $W_{10/2k}$ (W/kg) | Evaluation of iron loss | B50 (T) | Remarks |
| 27 | 0.64 | 13.1 | 38.1 | 111.1 | Excellent | 1.60 | Example |
| 28 | 0.64 | 16.4 | 37.7 | 125.7 | Poor | 1.60 | Comparative Example |
| 29 | 0.82 | 14.6 | 41.0 | 128.3 | Good | 1.62 | Example |
| 30 | 0.71 | 14.1 | 39.9 | 86.2 | Excellent | 1.61 | Example |
| 31 | 0.67 | 14.7 | 38.6 | 91.8 | Excellent | 1.60 | Example |
| 32 | 0.71 | 13.5 | 52.3 | 126.9 | Poor | 1.61 | Comparative Example |
| 33 | 0.58 | 13.1 | 38.5 | 93.4 | Excellent | 1.59 | Example |
| 34 | — | — | — | — | — | — | Comparative Example |
| 35 | — | — | — | — | — | — | Comparative Example |
| 36 | — | — | — | — | — | — | Comparative Example |
| 37 | 0.51 | 16.6 | 40.3 | 96.9 | Poor | 1.56 | Comparative Example |
| 38 | 0.61 | 16.2 | 41.1 | 79.8 | Poor | 1.59 | Comparative Example |
| 39 | 0.71 | 14.2 | 50.4 | 130.1 | Poor | 1.63 | Comparative Example |
| 40 | 0.71 | 13.1 | 40.3 | 100.0 | Excellent | 1.63 | Example |
| 41 | 0.71 | 15.9 | 48.0 | 122.3 | Poor | 1.63 | Comparative Example |
| 42 | 0.79 | 15.3 | 41.3 | 90.1 | Excellent | 1.63 | Example |
| 43 | 0.79 | 15.0 | 43.6 | 95.1 | Excellent | 1.64 | Example |
| 44 | 0.78 | 15.4 | 42.0 | 88.3 | Excellent | 1.62 | Example |
| 45 | 0.76 | 14.8 | 41.9 | 95.4 | Excellent | 1.64 | Example |
| 46 | 0.80 | 15.1 | 42.0 | 83.5 | Excellent | 1.63 | Example |
| 47a 47b | 0.76 | 12.9 | 40.1 | 99.5 | Excellent | 1.64 | Example |

REFERENCE SIGNS LIST 1 non-oriented electrical steel sheet
10 inner layer
20 surface layer.

The invention claimed is:

1. A non-oriented electrical steel sheet comprising an inner layer and surface layers provided on both sides of the inner layer,
   each of the surface layers having a chemical composition containing, in mass %,
   Si: 2.5% or more and 7.0% or less,
   Mn: 0.50% or less, and
   at least one selected from the group consisting of P: 0.010% or more and 0.100% or less, Sn: 0.001% or more and 0.10% or less, and Sb: 0.001% or more and 0.10% or less, with the balance being Fe and inevitable impurities,
   the inner layer having a chemical composition containing, in mass %,
   Si: 2.2% or more and 5.0% or less,
   Mn: 0.01% or more and 0.50% or less, and
   at least one selected from the group consisting of P: 0.010% or more and 0.100% or less, Sn: 0.001% or more and 0.10% or less, and Sb: 0.001% or more and 0.10% or less, with the balance being Fe and inevitable impurities,
   wherein the non-oriented electrical steel sheet has:
   a sheet thickness t of 0.01 mm or more and 0.35 mm or less;
   a multilayer ratio of $t_1$ to t represented by $t_1/t$ of 0.10 or more and 0.70 or less, where $t_1$ denotes a total thickness of the surface layers;
   a difference between $[Si]_1$ and $[Si]_0$ ($[Si]_1-[Si]_0$) represented by ΔSi of 1.0 mass % or more and 4.5 mass % or less, where $[Si]_1$ denotes a Si content in each of the surface layers and $[Si]_0$ denotes a Si content in the inner layer; and
   a difference between $[Mn]_0$ and $[Mn]_1$ ($[Mn]_0-[Mn]_1$) represented by ΔMn of 0.01 mass % or more and 0.40 mass % or less, where $[Mn]_0$ denotes a Mn content at a mid-thickness position t/2 and $[Mn]_1$ denotes an average Mn content in a region from a surface of the non-oriented electrical steel sheet to a position at a depth of (1/10)t.

2. The non-oriented electrical steel sheet according to claim 1, wherein ΔMn is 0.05 mass % or more and 0.40 mass % or less.

3. The non-oriented electrical steel sheet according to claim 2 further comprising a texture having {100}/{111} of 0.55 or more and 0.90 or less in a section of an orientation distribution function at $\Phi_2=45°$ in a plane at a depth of ¼ of the sheet thickness from a surface of the non-oriented electrical steel sheet, where {100}/{111} represents a ratio of an accumulation degree of {100} planes to an accumulation degree of {111} planes.

4. The non-oriented electrical steel sheet according to claim 1 further comprising a texture having {100}/{111} of 0.55 or more and 0.90 or less in a section of an orientation distribution function at $\Phi_2=45°$ in a plane at a depth of ¼ of the sheet thickness from a surface of the non-oriented electrical steel sheet, where {100}/{111} represents a ratio of an accumulation degree of {100} planes to an accumulation degree of {111} planes.

* * * * *